United States Patent
Ogino (10) Patent No.: US 7,707,540 B2
(45) Date of Patent: Apr. 27, 2010

(54) EXPOSURE DATA GENERATION METHOD AND DEVICE, EXPOSURE DATA VERIFICATION METHOD AND DEVICE AND STORAGE MEDIUM

(75) Inventor: Kozo Ogino, Kawasaki (JP)

(73) Assignee: Fujitsu Microelectronics Limited, Yokohama-shi (JP)

( * ) Notice: Subject to any disclaimer, the term of this patent is extended or adjusted under 35 U.S.C. 154(b) by 405 days.

(21) Appl. No.: 11/510,556

(22) Filed: Aug. 28, 2006

(65) Prior Publication Data

US 2007/0192758 A1 Aug. 16, 2007

(30) Foreign Application Priority Data

Feb. 14, 2006 (JP) .............................. 2006-037006

(51) Int. Cl.
*G06F 17/50* (2006.01)
(52) U.S. Cl. .................. 716/21; 716/4; 716/5; 716/19; 430/5; 430/30
(58) Field of Classification Search ................. 716/4–5, 716/19–21; 430/5, 30
See application file for complete search history.

(56) References Cited

U.S. PATENT DOCUMENTS

| 5,363,171 A | * | 11/1994 | Mack | ........................... | 355/68 |
| 5,933,212 A | * | 8/1999 | Kasuga | ........................ | 355/20 |
| 6,677,089 B2 | * | 1/2004 | Ogino et al. | ................... | 430/30 |
| 2002/0036273 A1 | * | 3/2002 | Okino | ..................... | 250/491.1 |
| 2005/0040344 A1 | * | 2/2005 | Osawa et al. | ............. | 250/492.2 |

FOREIGN PATENT DOCUMENTS

| JP | 11-8187 A | 1/1999 |
| JP | 2003-149784 A | 5/2003 |
| JP | 2005-101501 A | 4/2005 |

* cited by examiner

*Primary Examiner*—Jack Chiang
*Assistant Examiner*—Nghia M Doan
(74) *Attorney, Agent, or Firm*—Fujitsu Patent Center (57) ABSTRACT

Exposure verification is applied to exposure data indicating a pattern to be exposed by a charged particle beam. If an error point is extracted from the exposure data by the exposure verification, the values of coefficients are modified and exposure data is regenerated taking into consideration the coefficients whose values have been modified. Thus, exposure data is re-generated by changing each of the coefficient values within its appropriate range.

8 Claims, 11 Drawing Sheets

| EVALUATION POINT | RESOLUTION POSITION | PATTERN DATA IDENTIFICATION NAME |
|---|---|---|
| (−10.2, −212.5) | (−10.23, −212.5) | EXPOSURE EXPERIMENT IDENTIFICATION NAME |
| (59.3, 1.2) | (59.3, 1.23) | LAYOUT DATA IDENTIFICATION NAME |
| (60.3, 1.2) | (60.3, 1.25) | LAYOUT DATA IDENTIFICATION NAME |
| ... | ... | ... |

FIG. 3

| EVALUATION POINT: POINT ON THE EDGE | EVALUATION DIRECTION: OUTWARD | RESOLUTION POSITION ERROR | ERROR CONTENTS |
|---|---|---|---|
| (−10.2, −211.5) | (1, 0) | −10nm | E1(−10nm) |
| (−10.2, −212.5) | (1, 0) | −30nm | E1(−30nm), E3(−40nm,−20nm) |
| (59.3, 1.2) | (0, 1) | +30nm | E1(+30nm), E2(20%) |
| (60.3, 1.2) | (0, 1) | +50nm | E1(+50nm) |
| ... | ... | ... | ... |

E1 : PATTERN EDGE RESOLUTION POSITION ERROR (Δ)

E2 : EXPOSURE INTENSITY CONTRAST (C)

E3 : EXPOSURE AMOUNT MARGIN (Δ1, Δ2)

EXPOSURE DATA GENERATION METHOD AND DEVICE, EXPOSURE DATA VERIFICATION METHOD AND DEVICE AND STORAGE MEDIUM

CROSS-REFERENCE TO RELATED APPLICATIONS

This application is based upon and claims the benefit of priority from the prior Japanese Patent Application No. 2006-037006 filed on Feb. 14, 2006, the entire contents of which are incorporated herein by reference.

BACKGROUND OF THE INVENTION

1. Field of the Invention

The present invention relates to a technology for generating exposure data to expose a resist film formed on a multi-layered semiconductor substrate by a charged particle beam.

2. Description of the Related Art

Lately, in the manufacture of semiconductor devices, such as a large-scale integrated circuit (LSI) and the like, it is desired to form a very fine pattern. Thus, currently a charged particle beam is usually used for pattern generation exposure. It is common to use an electron for a charged particle.

By charged particle beam exposure, a part of charged particles inputted to a resist film is forward-scattered, a part of the particles that have transmitted the resist film are backward-scattered and it is inputted the resist film again. Thus, even when a charged particle beam is inputted to one point on the resist film, an area exposed by the charged particle is not only one point, but it also covers its neighborhood (proximity effect). Therefore, exposure data indicating the exposure pattern of a charged particle beam is usually formed by applying proximity effect correction to layout data indicating a pattern to be formed on the resist film in order to optimize the amount of exposure or dimensions of an exposure pattern (Japanese Patent Application Nos. 2005-101501, 2003-149784 and H11-8187).

With the recent fine semiconductor devices, the form of an exposure pattern for expose a semiconductor substrate has become fine and also its multi-layer structure has become complex. The backward scatter intensity of exposure to such a semiconductor substrate can be calculated with high accuracy by simulation based on a physical model (for example, simulation by a Monte Carlo method). However, actually it takes a very long time to calculate the intensity. Thus, it is desired to calculate the intensity in a shorter time while realizing higher accuracy.

As publicly known, the scatter of a charged particle varies depending on its material. In the prior art disclosed by Japanese Patent Application No. 2005-101501 (hereinafter "patent reference 1"), scatter distribution depending on a distance is prepared as a coefficient a and the backward scatter intensity of each area is calculated by an area density method. If intensity in an area (i, j) is expressed $Fb_{i,j}$, the $Fb_{i,j}$ is finally calculated as follows.

$$Fb_{i,j} = \sum_l \sum_m E_{n-1}(i+l, j+m; i, j) \cdot \alpha_{i+l,j+m} Q_{i+l,j+m} \quad (1)$$

In the above equation, $\alpha_{i+1,j+m}$, $Q_{i+1,j+m}$ and $E_{n-1}$ (i+1, j+1; i, j) represent pattern density in an area (i+1, j+m), the amount of exposure applied to an area (i+1, j+m) and a charged particle intensity coefficient indicating the degree of influence on an area (i+1, j+m) of the amount of exposure applied to an area (i, j), respectively.

The charged particle intensity coefficient $E_{n-1}$ corresponds to the coefficient a. The coefficient a can be calculated using a reflection coefficient R, which is a ratio indicating the reflection of a charged particle on a layer, and a transmission coefficient T indicating its ratio of transmitting through the layer prepared by each material. Thus, the backward scatter intensity $Fb_{i,j}$ taking the material of each layer into consideration can be calculated to realize high accuracy. This exposure data can also be appropriately generated in high accuracy.

In the manufacture of semiconductor devices, a factor of accuracy degradation due to a multi-layer structure, such as unevenness in thickness of lower layers, due to non-uniformity of chemical machine polish (CMP) or the accuracy error in dimensions of the pattern of a lower layer, sometimes occur. Stored energy distribution to the resist film varies depending on such a factor. Each value of the coefficients R and T varies depending on the occurrence and the degree of such a factor. Thus, an error occurs in the backward scatter intensity $Fb_{i,j}$ which is calculated according to equation (1). The influence of the error has a tendency to increase due to fine semiconductor devices. Therefore, in even wholly appropriate exposure data, an inappropriate point (poor resolution point) is easily detected by exposure verification. Thus, in the generation of exposure data, including exposure verification, it is also important to take such a factor of accuracy degradation into consideration.

In the prior art disclosed by Japanese Patent Application Nos. 2003-149784 and H11-8187, the amount of calculation is reduced by limiting a point for calculating stored energy including backward scatter intensity as an evaluation point.

SUMMARY OF THE INVENTION

It is an object of the present invention to provide a technology for generating exposure data taking into consideration a factor of accuracy degradation due to a multi-layer structure.

The exposure data generation method of the present invention generates exposure data for exposing a resist film formed on a multi-layered semiconductor substrate by a charge particle beam. The exposure data generation method comprises obtaining exposure data indicating a pattern to be exposed by the charge particle beam, which is generated from layout data indicating a pattern to be formed on the resist film, performing exposure verification the exposure data, using at least one changeable coefficient, modifying the value of a coefficient when an error point is extracted from the exposure data by exposure verification and re-generating exposure data taking into consideration the coefficient whose value is modified.

It is preferable to perform the exposure verification taking into consideration the backward scatter of the charged particle beam by a layer located below an exposure target layer on which a resist layer is formed. It is preferable to perform the exposure verification in two steps; the first exposure verification using a coefficient and the second exposure verification performed based on the result of the first exposure verification. The first exposure verification can also be performed by calculating the degree of risk for approximating the size of the backward scatter intensity. It is preferable to perform at least one of film thickness margin verification taking into consideration the error of the film thickness of a layer constituting the semiconductor substrate and area density margin verification taking into consideration the error of the dimensions of a pattern formed on the layer.

The exposure data verification methods in the first and second aspects of the present invention both verify exposure data for exposing a resist film formed on a multi-layered semiconductor substrate by a charged particle beam and each of them performs exposure verification as follows.

The exposure data verification method in the first aspect of the present invention calculates a plurality of the amount of exposure obtained on the resist film taking into consideration the error in film thickness of a layer constituting a semiconductor substrate and extracts a point to be considered inappropriate from exposure data.

The exposure data verification method in the second aspect of the present invention calculates a plurality of the amount of exposure obtained on the resist film taking into consideration the error in dimensions of a pattern formed on a layer constituting a semiconductor substrate and extracts a point to be considered inappropriate from exposure data.

In the present invention, exposure verification is applied to exposure data indicating a pattern to be exposed by a charge particle beam, using at least one changeable coefficient. If the exposure verification extracts an error point from the exposure data, the value of the coefficient and exposure data is regenerated taking into consideration the coefficient whose value is modified.

Some coefficient has an appropriate range taking into the factor of accuracy degradation due to a multi-layer structure. In exposure verification using such a coefficient, there is a possibility that the error point varies depending on a value adopted for the exposure verification. By such a possibility, a point that is not actually erroneous sometimes regarded as an error point. However, if a coefficient value is changed within the appropriate range and exposure data is re-generated, a point which should not be regarded as an error point can be prevented or suppressed from being regarded as an error point. Thus, an error point to be coped with can be more easily coped with. As a result, exposure data can also be more easily generated taking into consideration the factor of accuracy degradation due to the multi-layer structure.

In the present invention, a plurality of the amount of exposure obtained on a resist film can be calculated taking into consideration the error in film thickness of a layer constituting a semiconductor substrate, and a point which should be regarded inappropriate can be extracted from exposure data, based on the plurality of the calculated amount of exposure. Therefore, a part which is made erroneous by a film thickness error can be surely extracted.

In the present invention, a plurality of the amount of exposure obtained on a resist film can be calculated taking into consideration the error in dimensions of a pattern formed on a layer constituting a semiconductor substrate, and a point which should be regarded inappropriate can be extracted from exposure data, based on the plurality of the calculated amount of exposure. Therefore, a part which is made erroneous by a dimensional error of the formed pattern can be surely extracted.

Either of them facilitates coping with the factor of accuracy degradation due to a multi-layer structure.

DESCRIPTION OF THE PREFERRED EMBODIMENTS

The preferred embodiments of the present invention are described in detail below with reference to the drawings.

Figure 1:
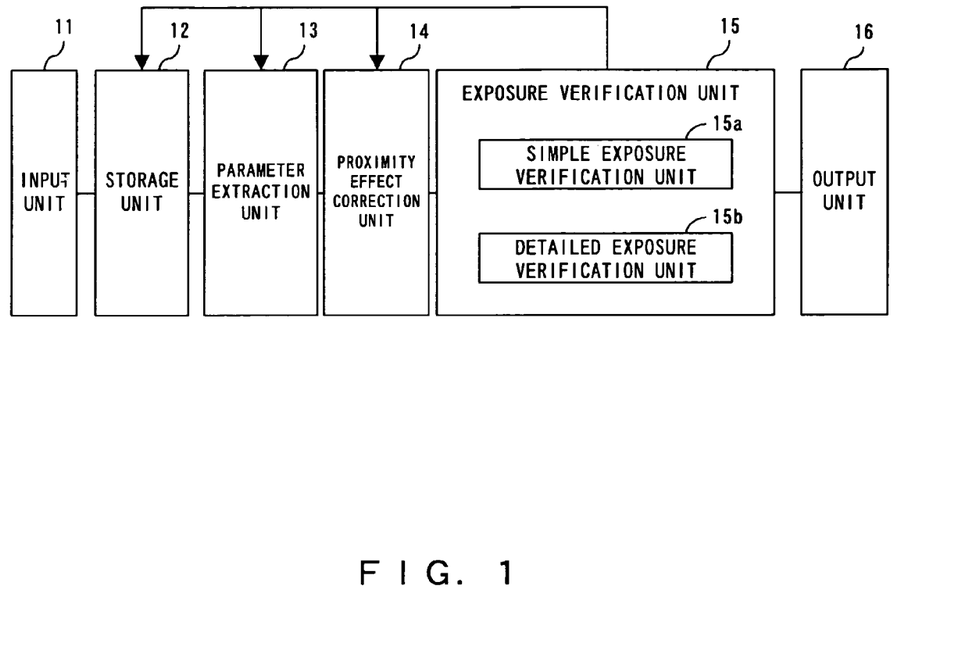
FIG. 1 shows the configuration of the exposure data generation device of the present invention.

FIG. 1 shows the configuration of the exposure data generation device of the present invention.

The exposure data generation device generates exposure data by inputting the layout data of each layer, and if a point which should be poor (error point) is detected by exposure verification, the generation device re-generates exposure data in such a way as to correct the point.

An input unit 11 is used to externally input layout data and exposure experiment data. In this preferred embodiment, exposure verification is performed using the method disclosed by Patent reference 1. The exposure experiment data is used to extract a coefficient needed for the exposure verification. Since the value of the coefficient is modified (updated) taking into consideration the factor of accuracy degradation due to a multi-layer structure, the coefficient is hereinafter called a "parameter". In this case, a plurality of parameters exists.

A storage unit 12 stores various types of data inputted by the input unit 11. A parameter extraction unit 13 extracts or modifies a parameter value from the exposure experiment data. A proximity effect correction unit 14 performs proximity effect correction using the parameter value inputted from the parameter extraction unit 13 to generate exposure data.

An exposure verification unit 15 applies exposure verification to the generated exposure data to extract an error point. The exposure verification unit 15 comprises a simple exposure verification unit 15a for performing (simple) exposure verification using the method disclosed by Patent reference 1 and a detailed exposure verification unit 15b for performing exposure verification by Monte Carlo method.

Simple exposure verification is applied to the entire exposure data while detailed exposure verification is applied to an error point detected by the simple exposure verification. Thus, exposure verification which takes much calculation time can be minimized, and exposure data can be generated more rapidly while realizing high accuracy.

If the error point extracted by simple exposure verification is confirmed to be erroneous by detailed exposure verification, the exposure verification unit 15 stores the error point in the storage unit 12 and instructs the parameter extraction unit 13 and the proximity effect correction unit 14 to perform the process again. Thus, the parameter extraction unit 13 updates the parameter value within an appropriate range determined taking into consideration the factor of accuracy degradation due to a multi-layer structure in such a way as to correct the error point. The proximity effect correction unit 14 re-generates exposure data after performing proximity effect correction using the updated parameter value.

The exposure verification unit 15 applies exposure verification to the regenerated exposure data again. If an error point is extracted again by the exposure verification, the exposure verification unit 15 instructs the parameter extraction unit 13 and the proximity effect correction unit 14 to perform the process again. Thus, exposure data which includes no error point when the factor of accuracy degradation due to a multi-layer structure is taken into consideration is generated. Such exposure data is outputted from an output unit 16.

Figure 11:
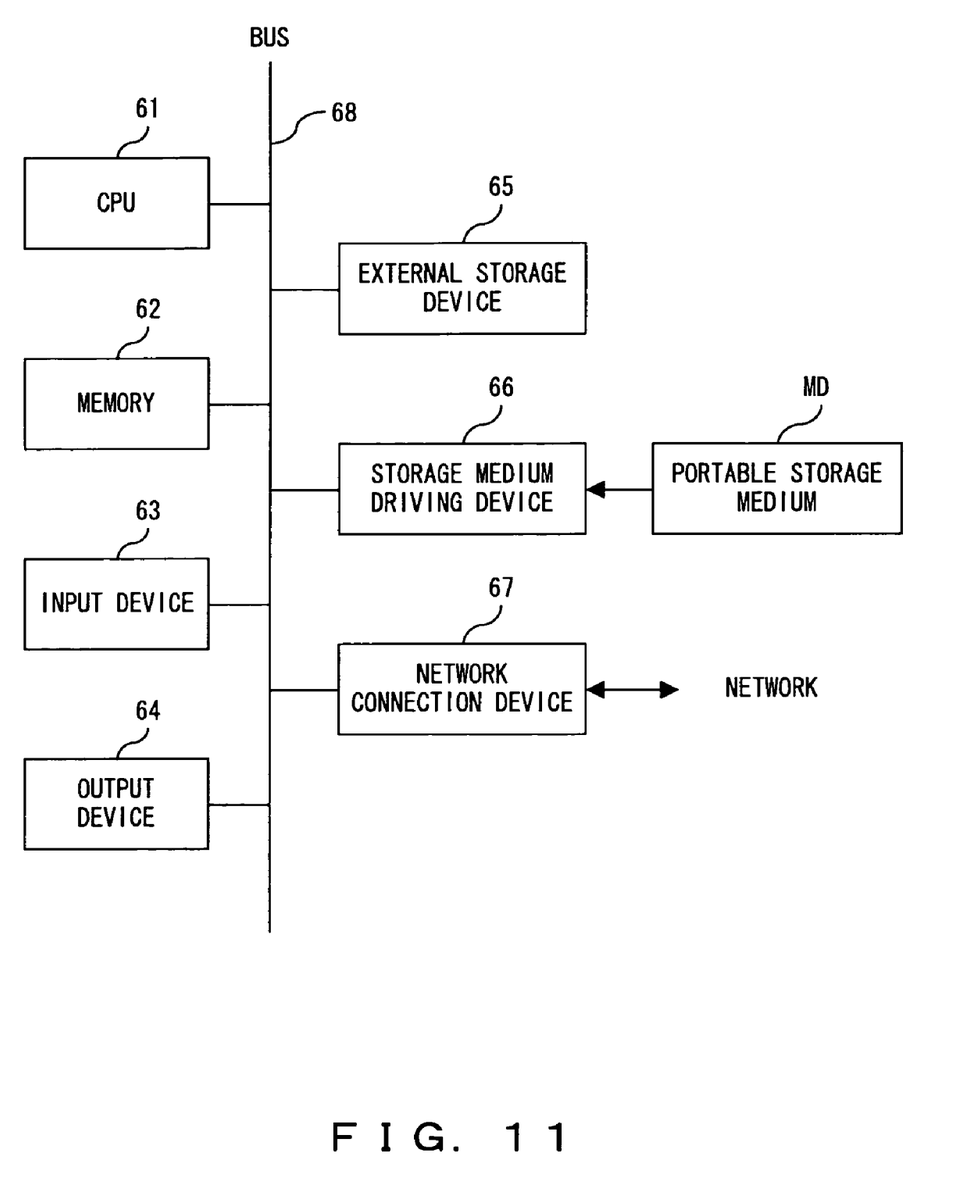
FIG. 11 shows an example of the hardware configuration of a computer capable of realizing the exposure data generation device of the present invention.

FIG. 11 shows an example of the hardware configuration of a computer capable of realizing the exposure data generation device. Prior to the detailed description of FIG. 1, the configuration of a computer capable of realizing the exposure data generation device is described in detail. For convenience' sake, the following description is made hereinafter presuming that the exposure data generation device is realized by one computer with the configuration shown in FIG. 11.

The computer shown in FIG. 11 comprises a CPU 61, memory 62, an input device 63, an output device 64, an external storage device 65, a storage medium driving device 66 and a network connection device 67, which all are connected to each other by a bus 68. The configuration shown in FIG. 11 is only one example and is not limited to this.

The CPU 61 is a central processing unit for controlling the entire computer.

The memory 62 is RAM or the like for temporarily storing a program or data stored in the external storage device 65 (or portable storage medium MD) when updating data or so on. The CPU 61 controls the entire computer by reading out the program into the memory 62 and executing it.

The input device 63 is connected to an input device, such as a keyboard, a mouse or the like or has it. The input device 63 detects the operator operation of such an input device and notifies the CPU 61 of the detection result.

The output device 64 is connected to a display or the like or has it. The output device 64 outputs data transmitted under the control of the CPU 61 on the display.

The network connection device 67 is used to communicate with another device via a network, such as an intranet, the Internet or the like. The external storage device 65 is a hard disk device or the like. The external storage device 65 mainly stores various types of data and programs.

The storage medium driving device 66 is used to access a portable storage medium MD, such as an optical disk, a magneto-optical disk or the like.

The layout data and the exposure experiment data are obtained via the network connection device 67 or the storage medium driving device 66 and are stored in the external storage device 65 or the like. Thus, the input unit 11 can be realized by the CPU 61, the memory 62, the external storage device 65, the network connection device 67, the storage medium driving device 66, and the bus 68. The storage unit 12 can be realized by the external storage device 65 or the memory 62. The generated exposure data is outputted via the network connection device 67 or the storage medium driving device 66. Therefore, the output unit 16 can be realized by the CPU 61, the memory 62, the external storage device 65, the network connection device 67, the storage medium driving device 66, and the bus 68. The others can be realized by the CPU 61, the memory 62, the external storage device 65, and the bus 68.

The exposure data generation device (exposure data verification device) of this preferred embodiment can be realized by the CPU 61 executing the program mounting functions necessary for it. The program can be recorded in the storage medium MD and be distributed. Alternatively, it can be obtained by the network connection device 67.

Figure 2:
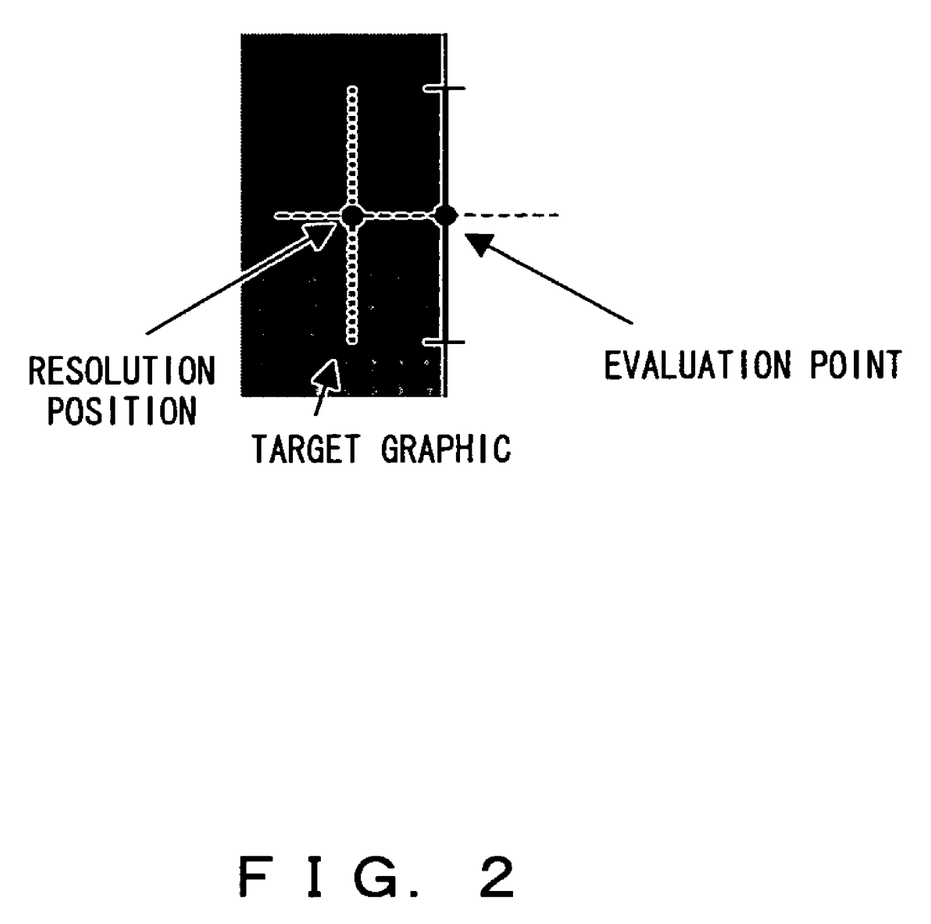
FIG. 2 shows how to detect an error point in exposure verification.

FIG. 2 shows how to detect an error point in exposure verification. A "target graphic", an "evaluation point" and a "resolution position" correspond to a pattern represented by layout data, a point to be verified, on the edge of the target graphic and an actually formed evaluation point on the pattern, respectively. In this preferred embodiment, basically an error point is extracted focused on the deviation in a position between the resolution position and the evaluation point.

Figure 3:
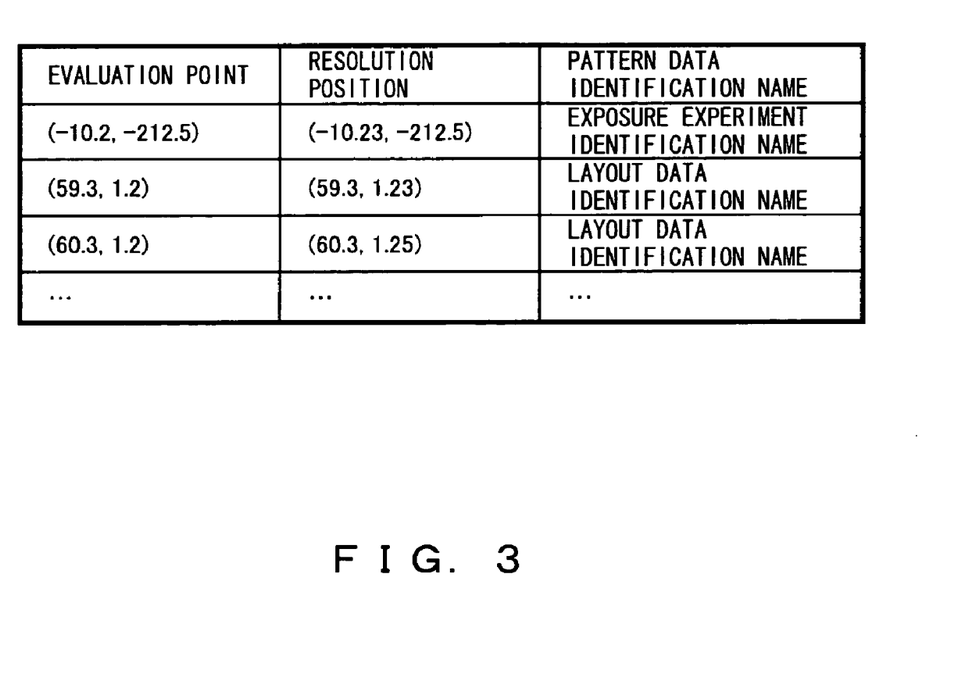
FIG. 3 shows a correction parameter extraction data management table.
Figure 4:
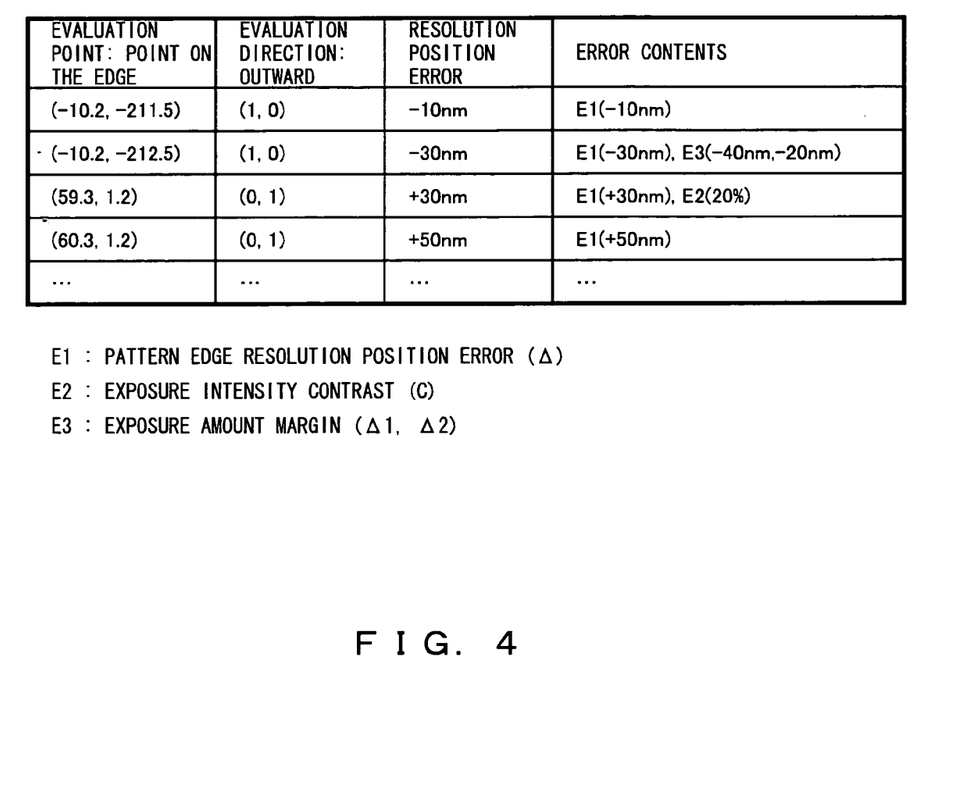
FIG. 4 shows a verification error management table.

FIG. 3 shows a correction parameter extraction data management table. The correction parameter extraction data management table is stored in the storage unit 12. The verification error management table shown in FIG. 4 is also stored in the storage unit 12. Hereinafter, the correction parameter extraction data management table and the verification error management table are called a "data management table" and an "error management table", respectively.

The data management table is prepared to manage/store parameter extraction data. The data management table stores each coordinates of the evaluation point and resolution position for each data type. A "layout data identification name" in FIG. 3 indicates layout data to which proximity effect correction is applied, that is, is an exposure data identification name.

The parameter extraction unit 13 refers to data stored in the data management table to determine the value of the parameter. For example, firstly, a parameter value such that the evaluation point and the resolution position is matched is extracted and determined. After that, a parameter value is extracted from newly stored data and an optimal one is determined taking into consideration each extracted parameter. The optimal parameter value is determined by least squares method, for example, using the first determined value as an initial value. As the parameter extraction method, the technology disclosed by Japanese Patent Application No. 2005-211042, whose patent the applicant has applied for Jul. 21, 2005 can be used.

Each parameter has an appropriate range. A parameter value must be determined taking the range into consideration. Thus, actually the parameter value is determined as follows.

In the backward scatter intensity calculation method disclosed by Patent reference 1, each of the transmission coefficient T, reflection coefficient R and diffusion length vindicating the 1/e radius of Gaussian distribution for each material of each layer has a physical range. The possible range of each parameter value of the film thickness of 0~∞ of a semiconductor substrate each layer of which is made of one kind of material is as follows.

$$0 \leq T \leq 1 \quad (2)$$

$$0 \leq R \leq \eta \text{ (backward scatter coefficient)} \quad (3)$$

$$0 \leq \sigma \leq \beta b \text{ (backward diffusion length)} \quad (4)$$

Since the range of each parameter value is for fixed film thickness, the range can be narrowed to some extent by extracting each parameter in the film thickness by simulation or the like in advance.

If simulation by Monte Carlo method is used, usually scatter in the case where a film made of a target material is placed at the vacuum and a lot of charged particles (hereinafter called "electron") is inputted to one point on its surface is simulated. In that case, the ratio of the total energy of electrons outputted from the surface of the film to the total energy of inputted electrons is the reflection coefficient R and a stretch (1/e radius) obtained when the energy distribution of electrons outputted from the surface of the film approximates Gaussian distribution corresponds to the diffusion lengths The ratio of the total energy of electrons outputted from the back surface of the film to the total energy of inputted electrons corresponds to the transmission coefficient T. Strictly speaking, since the amount of energy of electrons and the stored amount of energy in the resist is not matched, some allowance must be given to each of the calculated parameters $T_o$, $R_o$ and $\sigma_o$. Thus, a constant q indicating its allowance is externally specified, and the range of each of the parameter values T, R and σ is set according to the following expressions.

$$(1-q)T_o \leq T \leq q+(1-q)T_o \quad (5)$$

$$(1-q)R_o \leq R \leq q\eta+(1-q)R_o \quad (6)$$

$$(1-q)\theta_0 \leq \theta \leq q \beta b+(1-q)\sigma_o \quad (7)$$

If q=1, expressions (5)~(7) coincide with expressions (2)~(4). If q=0, they coincide with the values calculated by the simulation. Hereinafter, the lower and upper limits of the parameters are expressed as $T_{min}$, $R_{min}$ and $\sigma_{min}$ and $T_{man}$, $R_{man}$ and $\sigma_{man}$, respectively.

Firstly, each parameter value with an appropriate range indicated by expressions (5)~(7) is determined. The second time and after, the previously obtained value is corrected taking into consideration data newly stored in the data management table. Thus, an optimal value in the neighborhood of the previously obtained value can be determined for the parameter.

In this case, the range of each parameter value is restricted to the range indicated by expressions (5)~(7). However, if the number of the data newly stored in the data management table is small, the change of each parameter value is expected to be small. Therefore, the previously applied range can also be further narrowed around the initial value according to the ratio of the newly added data to the entire data. In that case, if the initial values are $T_{k-1}$, $R_{k-1}$, and a $\sigma_{k-1}$ and the ratio of newly added data to the entire data is p, the possible ranges of parameter values this time $T_k$, $R_k$ and $\sigma_k$ can also be restricted as follows.

$$pT_{min, k-1}+(1-p) T_{k-1} \leq T_k \leq pT_{max, k-1}+(1-p) T_{k-1} \quad (8)$$

$$pR_{min, k-1}+(1-p) R_{k-1} \leq R_k \leq pR_{max, k-1}+(1-p) R_{k-1} \quad (9)$$

$$p \sigma_{min, k-1}+(1-p) \sigma_{k-1} \leq \sigma_k \leq p \sigma_{max, k-1}+(1-p)\sigma_{k-1} \quad (10)$$

If each parameter exists out of a predetermined range when least squares method is used as a method for correcting the parameter value within the range, sometimes no square-sum $x^2$ becomes a minimum by existence of the parameter that a value is out of a range. Least squares method corresponds to calculating a set of parameter values in which square-sum $x^2$ becomes a minimum, using square-sum $x^2$ as the function of the set of parameter values. In this case, if square-sum $x^2(\alpha)$ is calculated according to an expression which monotonously increases out of the boundary as follows, assuming that only one parameter value α is used and its range is $\alpha1 \leq \alpha \leq \alpha2$, for convenience' sake, the range can be made to include a minimum value without fail when calculate square-sum $x^2$ (α) in an expression to increase monotonous outside from a border from the border.

$$x^2 (\alpha) (\alpha1 \leq \alpha \leq \alpha2) \quad (11)$$

$$x^2(\alpha)+k\alpha \times (\alpha1-\alpha) (\alpha<\alpha1) \quad (12)$$

$$x^2(\alpha)+k\alpha \times (\alpha-\alpha2) (\alpha2<\alpha) \quad (13)$$

In the above expressions, kα is a constant (>0) for speeding up the return of α from its deviation in the search of a minimum value by increasing the difference of α to some extent. The value can also be 1.

The above method can also extend similarly even if a plurality of parameter values exists. Therefore, by adopting this method, each parameter value can be corrected (determined) within each predetermined range. By such correction, only an actual error point or a point with such a high possibility remains in the exposure data. As a result, the developer can cope with a point to be coped with, thereby improving work efficiency and serviceability.

FIG. 4 shows a verification error management table.

This error management table is prepared to manage/store error points detected by exposure verification. The error management table stores the coordinates of an evaluation point, an outward direction evaluation vector, a resolution position error and its error contents for each error point.

An evaluation point is provided on an edge of a target graphic. For this reason, the outward direction evaluation vector (hereinafter called an "outward vector") indicates a vector which pass through the evaluation point from inside the target graphic and goes outward in unit vectors. Thus, for example, in FIG. 2, if there are the evaluation point and the resolution position on the X-axis and the resolution position is located in smaller coordinates than the revaluation point on the X-axis, the outward vector becomes (1, 0). If they are located reversely on the X-axis, it becomes (−1, 0).

The resolution position error indicates the respective errors of the evaluation point and the resolution position in the outward vector direction. Therefore, for example, similarly, if there are the evaluation point and the resolution position on the X-axis and the resolution position is located in smaller coordinates than the revaluation point on the X-axis, the resolution position error becomes negative. Thus, if an error occurs in the thick direction of a target graphic, the resolution position error becomes positive. If an error occurs in the reverse direction, it becomes negative.

In this preferred embodiment, a plurality of types of exposure verification is attempted. Each of E1~E3 shown in FIG. 4 indicates the type of exposure verification which detects an error. The exposure verification performed in this preferred embodiment is specifically described below with reference to FIGS. 5A~9B.

Figure 5A:
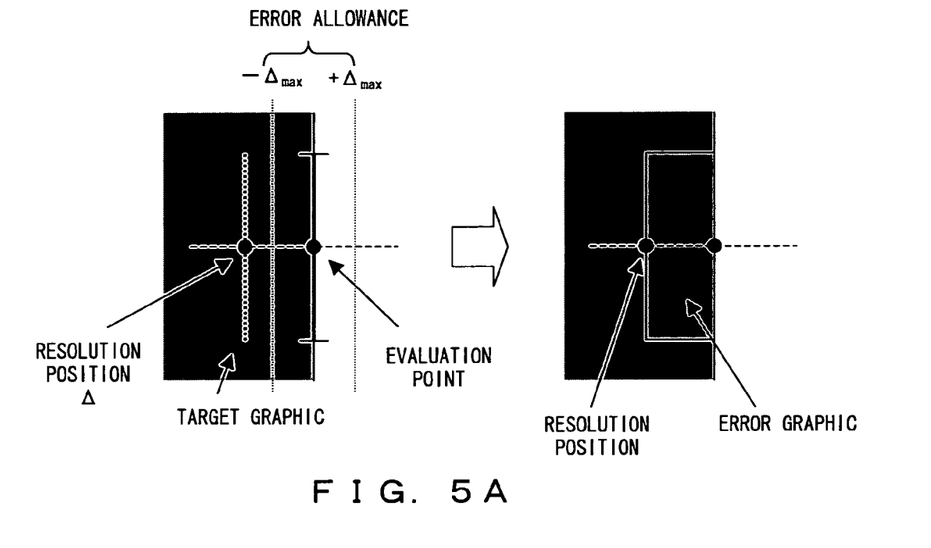
FIG. 5A shows how to display an error when the error is detected by a pattern edge resolution position error verification method.
Figure 5B:
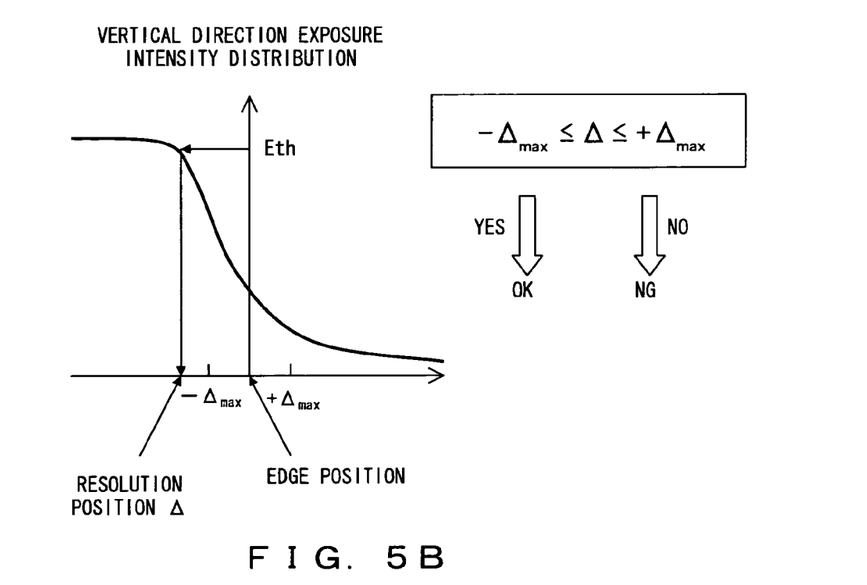
FIG. 5B shows how to detect an error by the pattern edge resolution position error verification method.

FIGS. 5A and 5B shows a pastern edge resolution position error verification method. FIG. 5A shows how to display an error when the error is detected by the pattern edge resolution position error verification method. FIG. 5B shows how to detect an error by the pattern edge resolution position error verification method.

In FIG. 5A, the resolution position Δ is located on the left of the evaluation point. Hereinafter, in FIGS. 6A~9A too, it is assumed for convenience' sake that the direction where the resolution position Δ and the evaluation point are arrayed is the X-axis. The direction from the resolution position Δ toward the evaluation point is the ascending direction of a position on the X-axis. A direction where layers are piled is called a vertical direction.

The vertical and horizontal axes of the graph shown in FIG. 5B indicate exposure intensity (amount of exposure) and a position on the X-axis, respectively. $E_{th}$ represents the threshold of the exposure intensity with which a pattern is formed. $\Delta_{max}$ represents the maximum value in the allowance in the outward vector direction(the X-axis direction here) using the evaluation point as the reference. Thus, the resolution position Δ range of $-\Delta_{max} \leq \Delta \leq \Delta_{max}$ is specified as its error allowance and no error is detected in the range.

In FIG. 5A, the resolution position Δ is located far away from $-\Delta_{max}$. The error graphic shown in FIG. 5A notifies that an error occurs due to it, and can be displayed as a rectangle having a width on an edge (the Y-axis here) covered by the evaluation point and a width (error) on the X-axis, of the evaluation point and the resolution position Δ. Data for displaying the error graphic can be outputted in the same file format as the layout data, exposure data or the like.

Figure 6A:
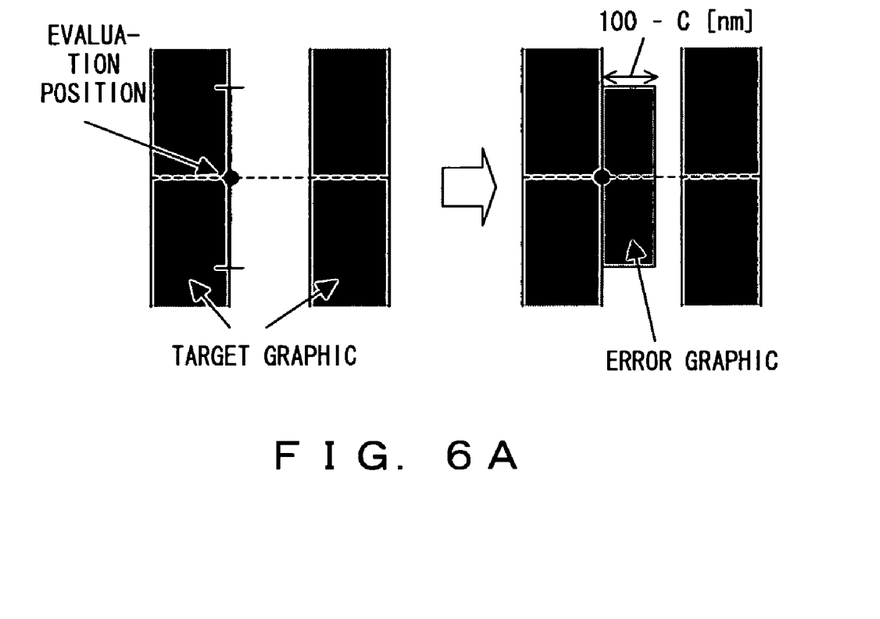
FIG. 6A shows how to display an error when the error is detected by an exposure intensity contrast verification method.
Figure 6B:
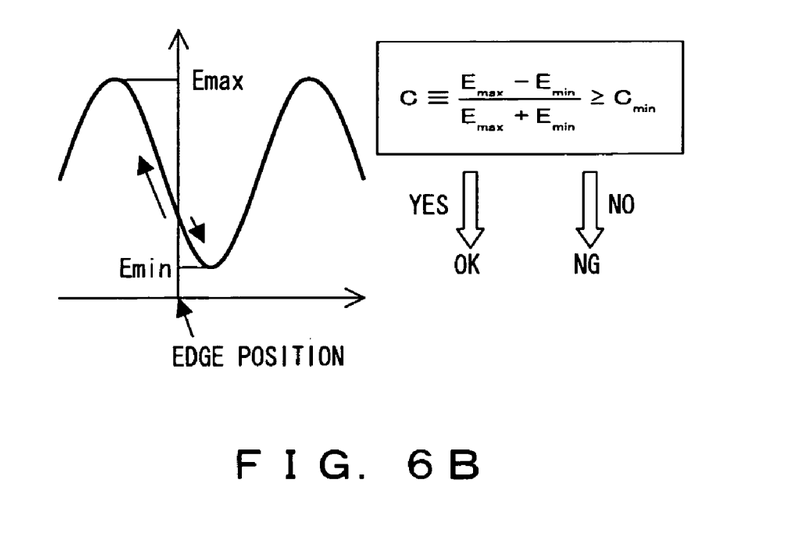
FIG. 6B shows how to detect an error by the exposure intensity contrast verification method.

FIGS. 6A and 6B shows an exposure intensity contrast verification method. Like FIGS. 5A and 5B, FIG. 6A shows how to display an error when the error is detected by the exposure intensity contrast verification method. FIG. 6B shows how to detect an error by the exposure intensity contrast verification method.

In this exposure intensity contrast verification method, a contrast value C $(=(E_{max}-E_{min})/(E_{max}+E_{min}))$ is calculated using the maximum exposure intensity $E_{max}$ in a target graphic and the minimum exposure intensity $E_{min}$ in the neighborhood of its outside. Whether or not an error occurs is checked by whether the calculated value C is equal to or more than the threshold $C_{min}$ which is predetermined as the allowable minimum value. The width on the X-axis of the error graphic in the case where the error occurs is a width obtained by multiplying a width with the target graphic adjacent on the X-axis, which has a corresponding evaluation point, by the value of 100-C.

Figure 7A:
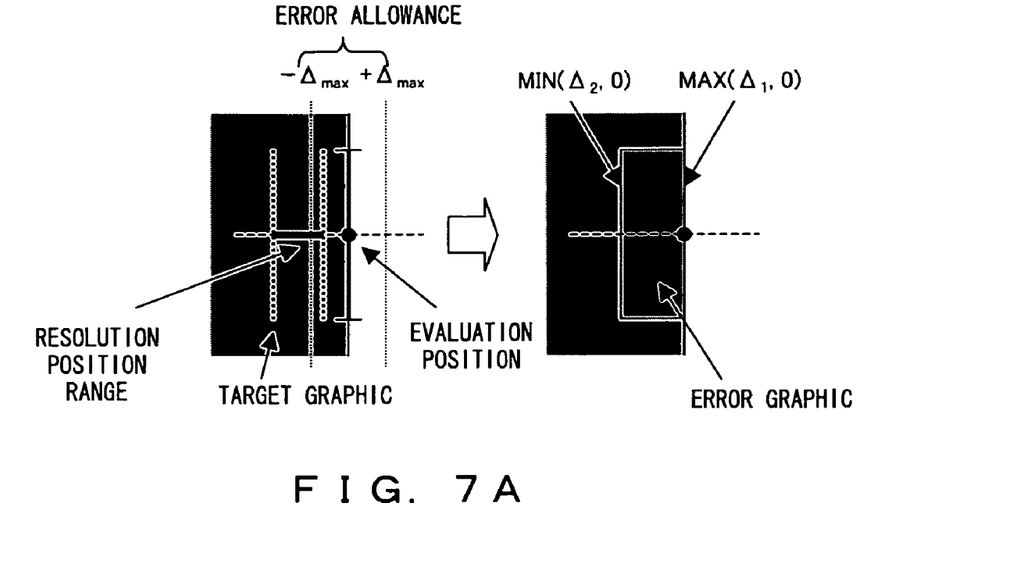
FIG. 7A shows how to display an error when the error is detected by an exposure amount margin verification method.
Figure 7B:
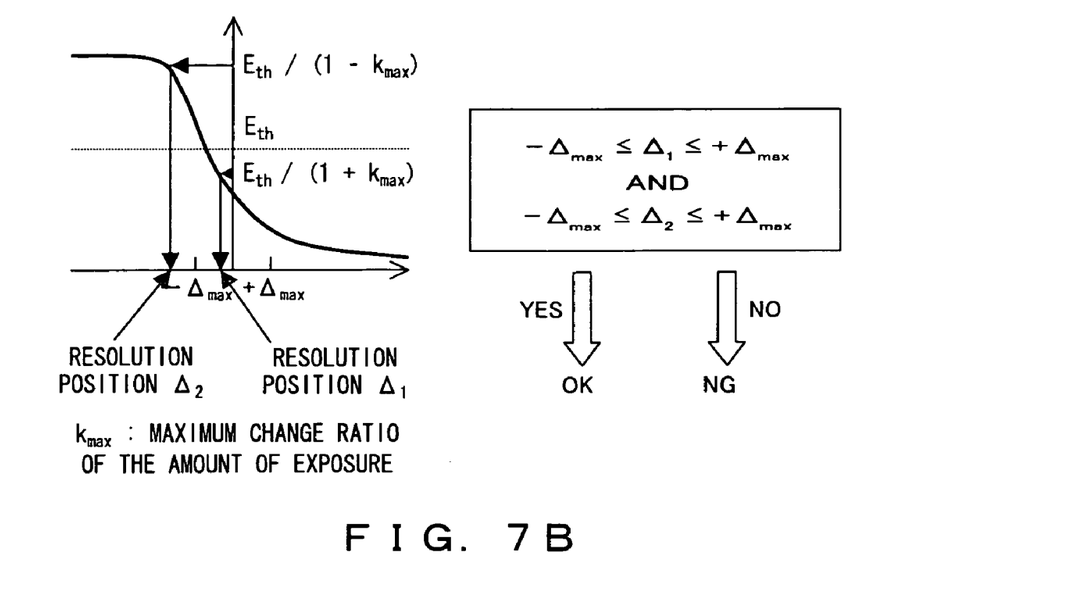
FIG. 7B shows how to detect an error by the exposure amount margin verification method.

FIGS. 7A and 7B shows an exposure amount margin verification method. Like FIGS. 5A and 5B, FIG. 7A shows how to display an error when the error is detected by the exposure amount margin verification method. FIG. 7B shows how to detect an error by the exposure amount margin verification method.

Exposure intensity needed to form a pattern depends on the material of an adopted resist film. This means that an actual edge position varies depending on the material of a resist film. Therefore, in this exposure amount margin verification method, as shown in FIG. 7B, the maximum change ratio $k_{max}$ is prepared to set the allowable range of exposure intensity (amount of exposure). Then, two resolution positions $\Delta_1$ and $\Delta_2$, which are $1/(1-k_{max})$ and $1/(1+k_{max})$, respectively of an exposure intensity threshold $E_{th}$ are calculated, and it is checked whether these resolution positions $\Delta_1$ and $\Delta_2$ both are within the error allowance. The width on the X-axis of the error graphic are one between those resolution positions $\Delta_1$ and $\Delta_2$.

Figure 8A:
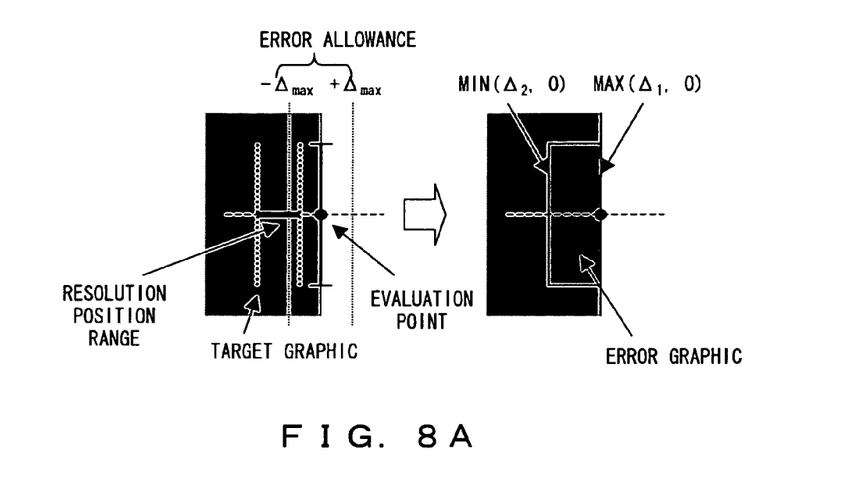
FIG. 8A shows how to display an error when the error is detected by a lower layer film thickness margin verification method.
Figure 8B:
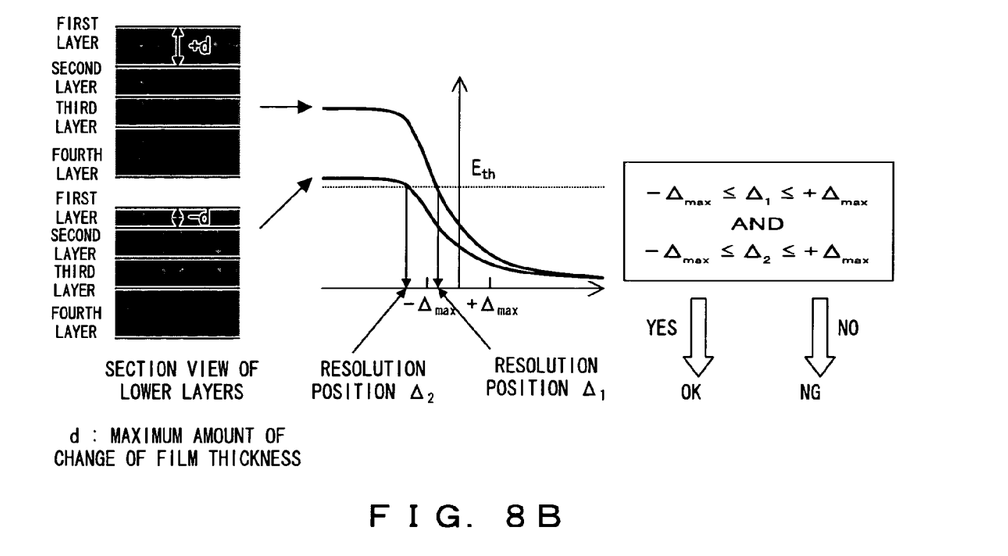
FIG. 8B shows how to detect an error by the lower layer film thickness margin verification method.

FIGS. 8A and 8B shows a lower layer film thickness margin verification method. Like FIGS. 5A and 5B, FIG. 8A shows how to display an error when the error is detected by the lower layer film thickness margin verification method. FIG. 8B shows how to detect an error by the lower layer film thickness margin verification method.

Backward scatter intensity varies depending on not only a material but also layer film thickness. If the parameter values are T, R and a and their respective values in the case where the film thickness becomes n times are $T_n$, $R_n$ and $\sigma_n$, the following relationship exists between those values. Therefore, exposure intensity varies depending on film thickness.

$$T_n = T_n \quad (14)$$

$$R_n = R(1-T_n^2)/(1-T^2) = R(1-T^{2n})/(1-T^2) \quad (15)$$

$$\sigma_n = n^{1/2}\sigma \quad (16)$$

The film thickness varies depending on the non-uniformity of chemical machine polish (CMP). It also varies depending on its position on the semiconductor substrate, its manufacturing process and the like. For this reason, in this lower layer film thickness margin verification method, as shown in FIG. 8B, the maximum possible amount of change d of the film thickness of a lower layer is taken into consideration. In each of the case where the film is thick by the maximum amount of change d and the case where the film is thin by the maximum amount of change d, resolution positions $\Delta_1$ and $\Delta_2$ whose exposure intensity is the threshold $E_{th}$ are calculated and it is checked whether those resolution positions $\Delta_1$ and $\Delta_2$ both are within its error allowance. Since it can be considered that an actual resolution position exists between those resolution positions $\Delta_1$ and $\Delta_2$, an error due to the error of film thickness can be surely detected. In this case, the width on the X-axis of an error graphic is one between the evaluation point and the resolution position $\Delta_2$.

Figure 9A:
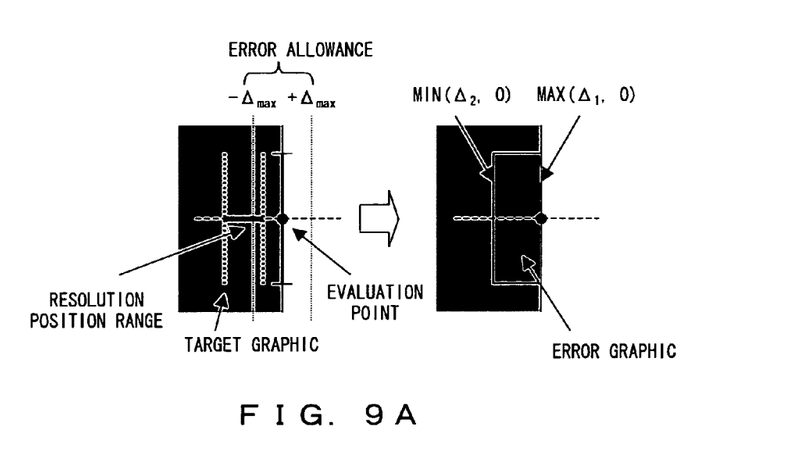
FIG. 9A shows how to display an error when the error is detected by a lower layer area density margin verification method.
Figure 9B:
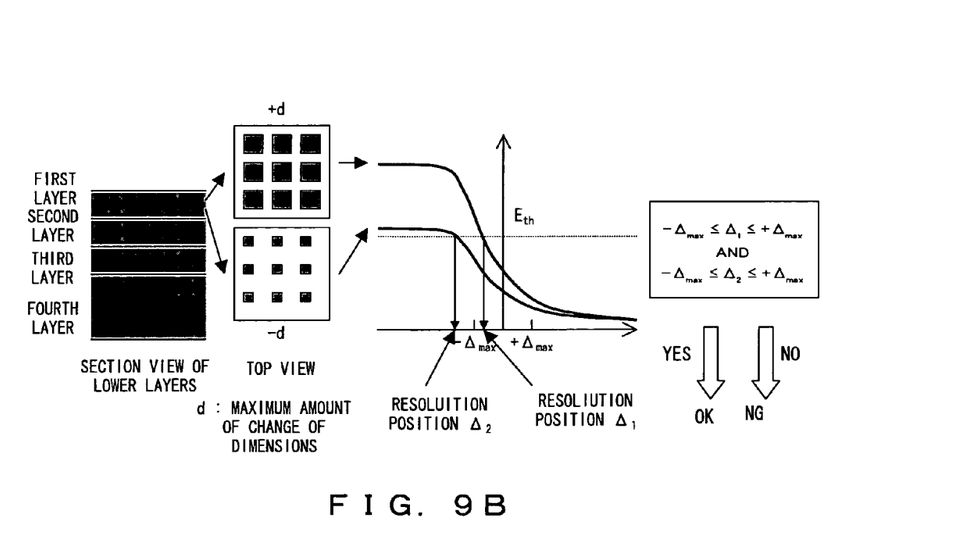
FIG. 9B shows how to detect an error by the lower layer area density margin verification method.

FIGS. 9A and 9B shows a lower layer area density margin verification method. Like FIGS. 5A and 5B, FIG. 9A shows how to display an error when the error is detected by the lower layer area density margin verification method. FIG. 9B shows how to detect an error by the lower layer area density margin verification method.

Backward scatter intensity varies depending on a material. The area density of the lower layer area density margin verification method varies depending on an error in pattern generation. For example, as shown in FIG. 9B, if an object indicated by a rectangle in the top view of a layer is a contact hole, it can be considered that the maximum amount of change d exists in the width (dimensions) of the contact hole. If such an amount of change d exists, exposure intensity varies between the case where the dimensions is thick by the maximum amount of change d and the case where the dimensions is thin by the maximum amount of change d. For this reason, in this lower layer area density margin verification method, as shown in FIG. 9B, the maximum possible amount of change d of the dimensions of a pattern formed on a lower layer is taken into consideration. Then, two resolution positions $\Delta_1$ and $\Delta_2$, which are the case where the dimensions is thick by the maximum amount of change d and the case where the dimensions is thin by the maximum amount of change d, respectively of an exposure intensity threshold $E_{th}$ are calculated, and it is checked whether these resolution positions $\Delta_1$ and $\Delta_2$ both are within the error allowance. Since it can be considered that an actual resolution position exists between those resolution positions $\Delta_1$ and $\Delta_2$, an error due to an error in the dimensions of a formed pattern can be surely detected. In this case, the width on the X-axis of an error graphic is one between the evaluation point and the resolution position $\Delta_2$.

E1-3 shown in FIG. 4 indicate errors detected by the pattern edge resolution position error verification method, the exposure intensity contrast verification method and the exposure amount margin verification method, respectively. In their parentheses of symbols "E1", "E2" and "E3", an error from the evaluation point of the resolution position A, contrast value C and errors from the evaluation point of two resolution positions $\Delta_1$ and $\Delta_2$, respectively are shown.

In the exposure verification unit 15, each of the simple exposure verification unit 15a and the detailed exposure verification unit 15b perform exposure verification using the various types of verification methods described above. Thus, exposure data is generated by modifying parameter values while avoiding the actual occurrence of an error with high accuracy.

Figure 10:
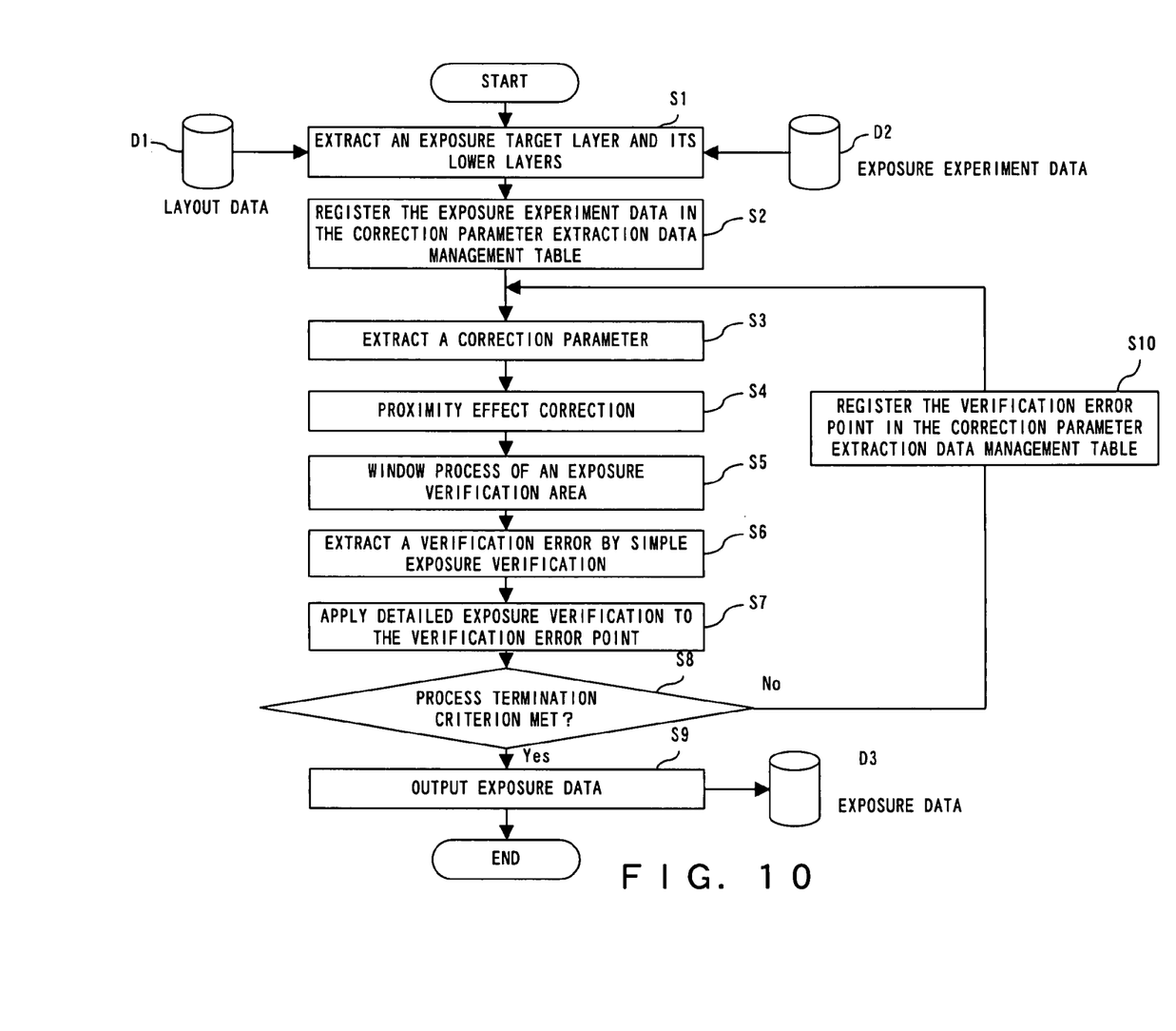
FIG. 10 is the flowchart of the exposure data generation process.

FIG. 10 is the flowchart of the exposure data generation process. Next, the process of generating exposure data and its flow are described in detail with reference to FIG. 10. The generation process can be realized, for example, by the CPU 61 shown in FIG. 11 executing a program stored in the external storage device 65 or a storage medium MD. Thus, the exposure data generation device of the present invention can be realized by the computer whose configuration is shown in FIG. 11 executing the program. Here, the following description assumes that the external storage device 65 (storage unit 12) stores layout data D1 and exposure experiment data.

Firstly, in step S1, the layout data D1 is read from the external storage device 65 and layout data of an exposure target layer and its lower layer is extracted. In step S2, the correction parameter extraction data management table (FIG. 3) is stored in an area secured in RAM 62 or the like. Then, the exposure experiment data 2 is read from the external storage device 65 and is registered in the table.

In step S3, parameter values are extracted from the data stored in the data management table. In step S4, proximity effect correction is applied to the layout data of the exposure target layer using the extracted parameter values to generate exposure data. In step S5, a window process is applied to the entire exposure verification area (exposure data) to extract the importance point of design.

In this window process, its design rules are checked and a point requiring high accuracy is extracted as the importance point of design.

In step S6, simple exposure verification is performed to extract an error point. Then, the extracted error point is registered in the verification error management table (FIG. 4). In step S7, detailed exposure verification is applied to the error point registered in the error management table, and a point that is not determined to be erroneous by the verification is deleted from the error management table.

In step S8, it is determined whether the process termination criterion is met. If no error point is registered in the error management table, if no change exists in the registered error or if a parameter value cannot be updated within a predetermined range, it is determined that the process termination criterion is met and its determination is yes. Then, lastly, in step S9, the exposure data D3 that is generated when performing step S4 is outputted and the series of processes terminate. Otherwise, its determination is no and the flow proceeds to step S10. In step S10, the error point registered in the error management table is registered in the data management table and the flow returns to step S3.

In step S3, the parameter values are updated (corrected) taking into consideration the data (error point) added to the data management table. In step S4, exposure data is re-generated. In step S5, the window process is applied only to the error point registered in the error management table and then the error management table is cleared (initial setting). In this way, the second time and after, in steps S3~S5, processes whose contents are different from those of the first time are performed. In step S6, since simple exposure verification can be performed in high speed, the simple exposure verification is applied to the entire exposure verification area. However, the simple exposure verification can also be applied only to the point extracted by the window process.

In the multi-layered semiconductor device, the above described exposure data generation process is performed for each layer. Thus, appropriate exposure data can be obtained for each layer.

Although in this preferred embodiment, the method disclosed by Patent reference 1 is adopted as the simple exposure verification method (for the calculation of the backward scatter intensity), another method can also be adopted. Since, for example, in a point greatly influenced by backward scatter, the exposure intensity is high in a non-exposure part, the amount of exposure must be reduced in an exposure part. As a result, resolution (contrast) tends to degrade. For that reason, such a point is sometimes called the degree of risk as a simple evaluation index. The degree of risk corresponds to the size of backward scatter intensity, that is, approximates the size. The degree of risk (i, j) of an area (i, j) is calculated as follows. In the following equation, "$\alpha_k(i, j)$" and "$(1-\alpha_k(i, j))$" are the pattern area density of a heavy material in a layer k and that of a light material, respectively.

$$\text{Degree of risk}(i, j) = \prod_{k=1}^{N} [C_k \alpha_k(i, j) + D_k\{1 - \alpha_k(i, j)\}]m \quad (17)$$

When the surface of the semiconductor substrate is the same in a sufficiently wide range, the size of the backward scatter intensity has the following tendency.

(1) The higher the ratio of a heavy material (corresponding to a pattern area density) is, the larger the backward scatter intensity is.

(2) The thicker the thickness of a heavy material is, the larger the backward scatter intensity is. There is a relationship of $C_k > D_k$ between coefficients $C_k$ and $D_k$ which are multiplied to $\alpha_k(i, j)$ and $(1-\alpha_k(i,j))$, respectively, due to the tendency (1). Therefore, the larger the number of layers containing a heavy material, the higher the degree of risk becomes. Thus, the tendency (2) is also taken into consideration. For example, if in the case of two-layered semiconductor substrate, 100% of a heavy material and 100% of a light material exist in the first and second layers, the degree of risk becomes $C_1 \times D_2$. If 100% of a heavy material also exists in the second layer, the degree of risk becomes $C_1 \times C_2$. Since $C_2 > D_2$, in this example, the degree of risk of the latter is higher. Thus, in the calculated degree of risk, the tendencies (1) and (2) both are taken into consideration. Therefore, it can be used to specify an error point or a point with such a possibility.

The appropriate value of each of the coefficients $C_k$ and $D_k$ varies depending on film thickness and area density (pattern dimensions, etc.) like the parameters T, R and σ and has an appropriate range. For this reason, even when the degree of risk is used for exposure verification, as a whole, each process can be performed according to the flow shown in FIG. 10.

What is claimed is:

1. An exposure data generation method using a computer for generating exposure data for exposing a resist film formed on a multi-layered semiconductor substrate by a charged particle beam, comprising:
   obtaining exposure data indicating a pattern to be exposed by the charge particle beam and an amount of exposure of the charge particle beam generated from layout data indicating a pattern to be formed on the resist film;
   performing exposure verification for extracting an inappropriate point of the exposure data, using at least one of a reflective coefficient and a transmission coefficient for calculating a backward scatter intensity;

modifying the value of the at least one of the reflective coefficient and the transmission coefficient when the inappropriate point is extracted from the exposure data by the exposure verification;

calculating the backward scatter intensity using the at least one of the reflective coefficient and the transmission coefficient whose value is modified; and re-generating exposure data by correcting the pattern or the amount of exposure of the exposure data based on calculated backward scatter intensity.

2. The exposure data generation method according to claim 1, wherein
the exposure verification is performed taking into consideration backward scatter of a charged particle beam by a layer located below an exposure target layer on which a resist film is formed.

3. The exposure data generation method according to claim 1, wherein performing
the exposure verification includes a first exposure verification using the at least one coefficient and a second exposure verification performed based on a result of the first exposure verification.

4. The exposure data generation method according to claim 3, wherein
in the first exposure verification, a value for approximating a size of backward scatter intensity is calculated and the exposure verification is performed using the value.

5. The exposure data generation method according to claim 1, wherein as the exposure verification, at least one of film thickness margin verification taking into consideration an error caused in film thickness of a layer constituting the semiconductor substrate and area density margin verification taking into consideration an error in dimensions of a pattern formed on the layer.

6. The exposure data generation method according to claim 1, wherein
the at least one coefficient includes at least one of a reflection coefficient and a transmission coefficient.

7. An exposure data generation device for generating exposure data for exposing a resist film formed on a multi-layered semiconductor substrate by a charged particle beam, the device comprising:

a data acquisition unit to obtain exposure data indicating a pattern to be exposed by the charge particle beam and an amount of exposure of the charge particle beam generated from layout data indicating a pattern to be formed on the resist film;

an exposure verification unit to perform exposure verification for extracting an inappropriate point of the exposure data, using at least one of a reflective coefficient and a transmission coefficient for calculating a backward scatter intensity;

a of the reflective coefficient and the transmission coefficient modification unit to modify a value of the at least one coefficient when the inappropriate point is extracted from the exposure data by the exposure verification; and a data generation unit to calculate the backward scatter intensity using the at least one of the reflective coefficient and the transmission coefficient whose value is modified, and to re-generate exposure data by correcting the pattern or the amount of exposure of the exposure data based on calculated backward scatter intensity.

8. A computer-readable storage medium on which is recorded a program, which when executed by a computer, causes the computer to perform a method, the method comprising:

obtaining exposure data indicating a pattern to be exposed by the charge particle beam and an amount of exposure of the charge particle beam, generated from layout data indicating a pattern to be formed on the resist film;

performing exposure verification for extracting an inappropriate point of the exposure data, using at least one of a reflective coefficient and a transmission coefficient for calculating a backward scatter intensity;

modifying a value of the at least one of the reflective coefficient and the transmission coefficient when the inappropriate point is extracted from the exposure data by the exposure verification;

calculating the backward scatter intensity using the at least one of the reflective coefficient and the transmission coefficient whose value is modified; and re-generating exposure data by correcting the pattern or the amount of exposure of the exposure data based on calculated backward scatter intensity.

* * * * *